United States Patent
Poulo

(10) Patent No.: US 9,672,089 B2
(45) Date of Patent: Jun. 6, 2017

(54) METHOD TO DETERMINE BER (BIT ERROR RATE) FROM AN EYE DIAGRAM

(71) Applicant: Tektronix, Inc., Beaverton, OR (US)

(72) Inventor: Richard J. Poulo, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 234 days.

(21) Appl. No.: 14/519,703

(22) Filed: Oct. 21, 2014

(65) Prior Publication Data

US 2016/0110237 A1      Apr. 21, 2016

(51) Int. Cl.
  G06F 11/07      (2006.01)
  G01R 13/02      (2006.01)
  G01R 31/317     (2006.01)
  G06F 11/36      (2006.01)

(52) U.S. Cl.
  CPC ......... G06F 11/076 (2013.01); G01R 13/029 (2013.01); G01R 31/3171 (2013.01)

(58) Field of Classification Search
  CPC . G06F 11/076; G06F 11/0766; G01R 13/029; G01R 31/3171; H04B 17/00
  See application file for complete search history.

(56) References Cited

U.S. PATENT DOCUMENTS

| | | | |
|---|---|---|---|
| 2004/0125874 A1* | 7/2004 | Baumert | H04L 1/205 375/226 |
| 2006/0018374 A1 | 1/2006 | Nelson et al. | |
| 2006/0109896 A1* | 5/2006 | Steinbach | G01R 31/31709 375/226 |
| 2007/0121759 A1 | 5/2007 | Sonntag et al. | |
| 2007/0156360 A1* | 7/2007 | Romero | G01R 31/31709 702/69 |
| 2007/0274378 A1 | 11/2007 | Warke | |

FOREIGN PATENT DOCUMENTS

WO      2007/107871 A2     9/2007

OTHER PUBLICATIONS

Matricciani, "A Model of the Probability Distribution of the Signal-to-Noise Ratio Estimated from BER Measurements," Vehicular Technology Conference (VTC Fall), 2011, IEEE, Sep. 5, 2011, pp. 1-5.

Extended European Search Report for European Patent Application No. 15190826.6, mailed Mar. 3, 2016, 6 pages.

* cited by examiner

*Primary Examiner* — April Y Blair
*Assistant Examiner* — Dipakkumar Gandhi
(74) *Attorney, Agent, or Firm* — Marger Johnson

(57) ABSTRACT

A system and method for calculating a bit error rate for a mask is described. For each time during the time duration of the mask, the minimum and maximum voltages of the mask at that time are determined. The maximum bit error rate can be calculated for each time by integrating between those voltages. The maximum bit error rate for all times during the time duration of the mask can be selected as the maximum bit error rate for the mask.

25 Claims, 12 Drawing Sheets

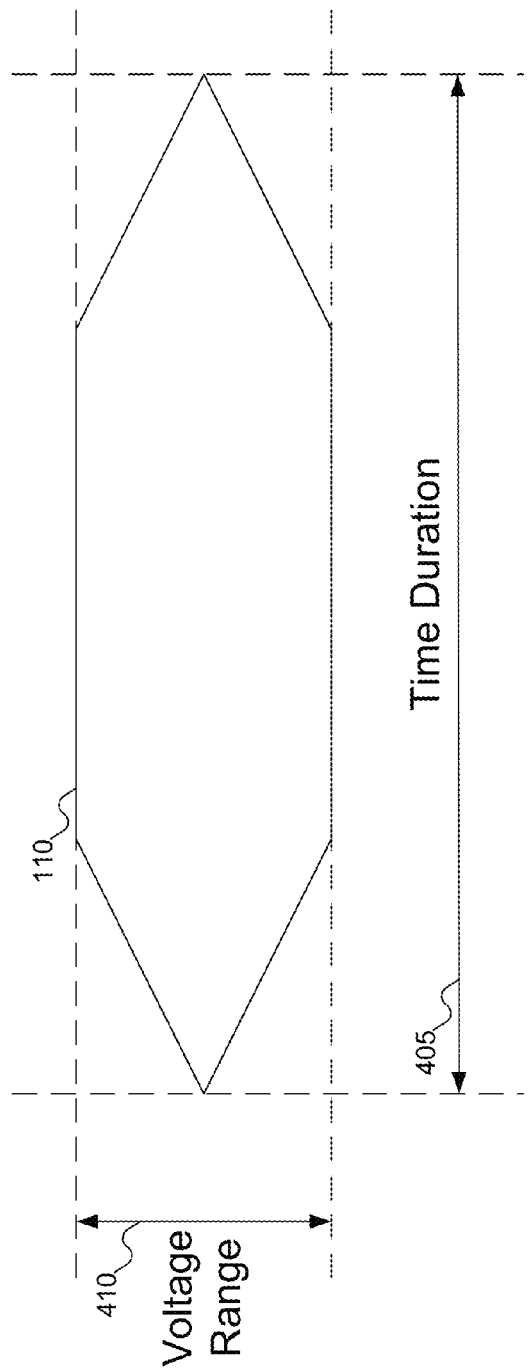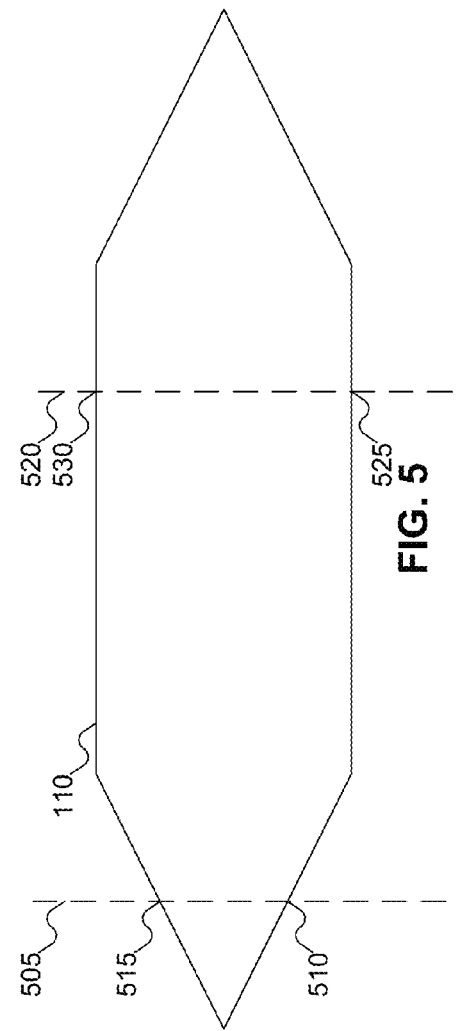

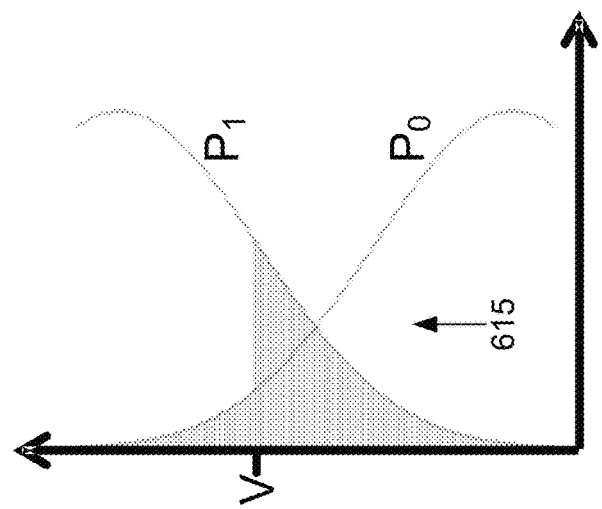
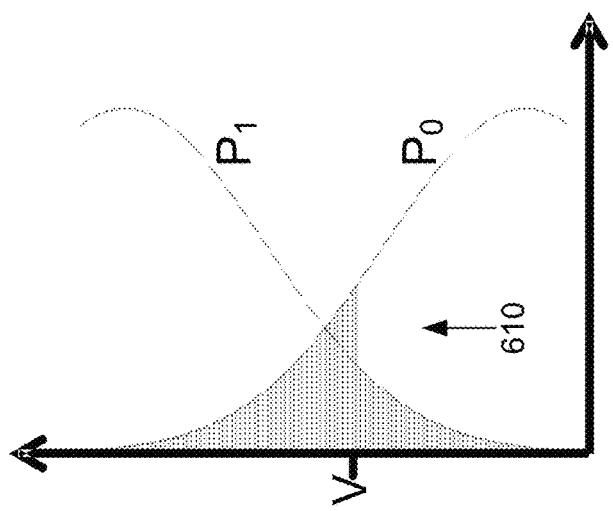
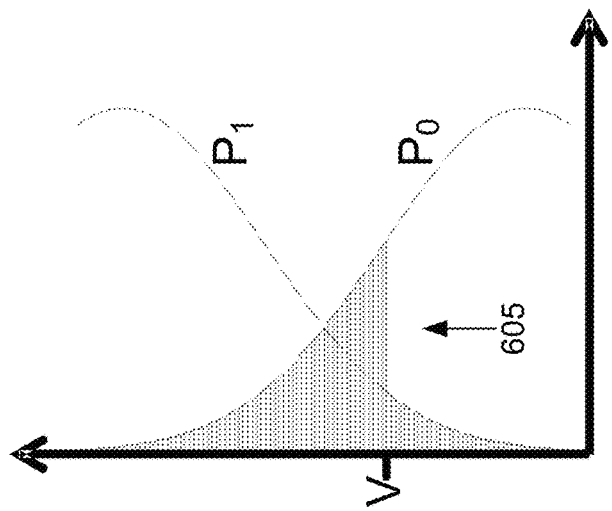
FIG. 6C
FIG. 6B
FIG. 6A

METHOD TO DETERMINE BER (BIT ERROR RATE) FROM AN EYE DIAGRAM

BACKGROUND

This invention relates to masks in eye diagrams, and more particularly to determining a bit error rate for a mask in an eye diagram.

There are several ways to determine a bit error rate for an eye diagram. For example, given partial eye information it is possible to compute the bit error rate for a mask within the eye diagram. But calculating the partial eye information requires controlling both the sending and the reception of the signal. If the equipment calculating the eye diagram does not control both the sending and the reception of the signal, the partial eye information cannot be calculated. As a consequence, the equipment cannot calculate the bit error rate for a mask within the eye diagram using the partial eye information.

Embodiments of the invention address this and other problems with the prior art.

BRIEF DESCRIPTION OF THE DRAWINGS

FIG. 4 shows the time duration and voltage range of the mask of FIG. 1.

FIG. 5 shows some times during the time duration of the mask of FIG. 1, with corresponding minimum and maximum voltages.

FIGS. 6A-6C show graphs of voltage versus bit error rates.

DETAILED DESCRIPTION

Before describing how to perform mask testing using embodiments of the invention, it is helpful to understand how mask testing can otherwise be performed. Some terminology needs to be defined first. It is assumed throughout that 0 and 1 bits occur with equal probability 0.5. A person of ordinary skill in the art will understand embodiments of the claimed invention could be generalized to bits that occur with other frequencies.

PDF—Probability Distribution Function

A probability distribution function describes how probability is distributed over a domain as a probability density and/or probability mass. A probability density is a function of one or more variables, the number of variables depending on the dimensionality of the domain.

When dealing with waveforms, probability density functions are typically represented as arrays of one-dimensional PDFs of the form P(t,v). For each time T, P(T,v) is a PDF of voltage only and tells us the probability density that the signal voltage has a certain value at time T. Because the signal must take some voltage, each PDF integrates to 1 over its entire domain which is the voltage interval $(-\infty, +\infty)$.

$\int_{-\infty}^{\infty} P(T,v)dv = 1$

Note that T is fixed in this equation. Therefore, this equation includes only one variable. Nor is it true that for a given voltage V that P(t,V) is a PDF over time: a given voltage might never be used in the waveform.

When dealing with single voltage measurements at random times, both v and t are variable. Thus, two-dimensional PDFs of the form P(t,v) are functions of both voltage and time. In this case the normalization is as follows.

$\int_0^{TUI} \int_{-\infty}^{\infty} P(t,v) dv dt = 1$

Obviously confusion can arise from this mixed usage of the notation "P(t,v)" for both an array of one-dimensional PDFs and a single two-dimensional PDF. Unless otherwise specified, any reference to "P(t,v)" is intended to refer to an array of one-dimensional PDFs.

PDF Eye

Figure 1:
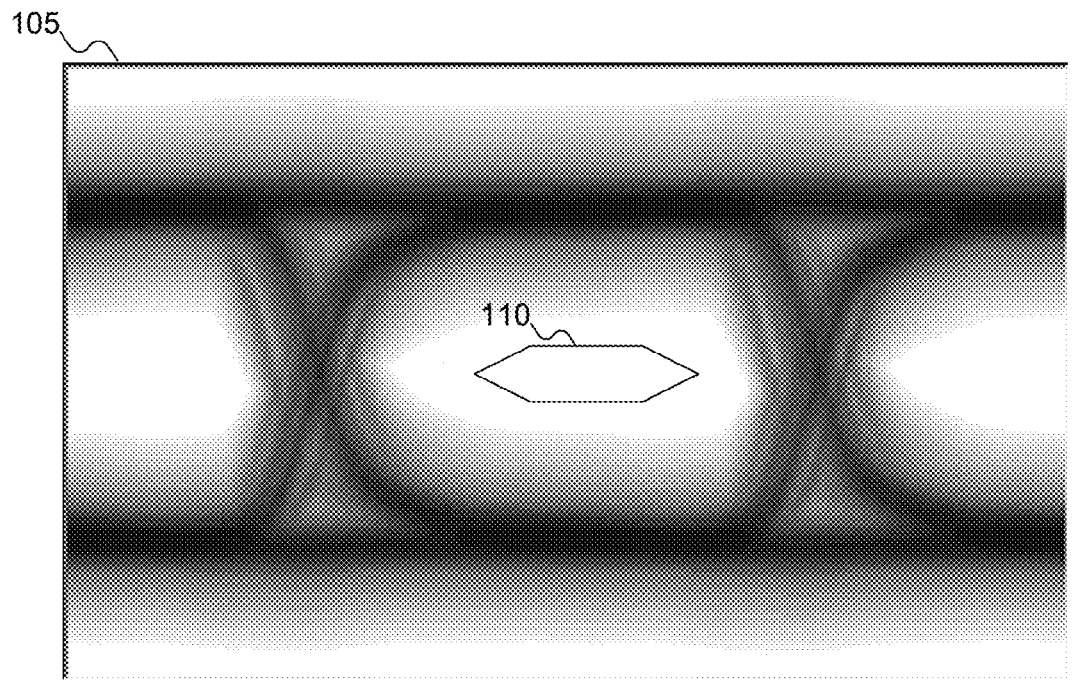
FIG. 1 shows an eye diagram and a mask.

A PDF eye is a function P(t,v) which can be either of the two functions (the array of one-dimensional PDFs or the two-dimensional PDF) discussed above. The choice is determined by how the data defining the eye is obtained. Assuming the eye is created by capturing and overlaying waveforms or generated from a model, P(t,v) is an array of one-dimensional PDFs. The eye can be enhanced by mathematically applying jitter and noise PDFs to that eye. FIG. 1 shows an example of a PDF eye. The darker areas of the figure represent areas with higher probability that the signal has the indicated voltage at the indicated time.

Figure 2:
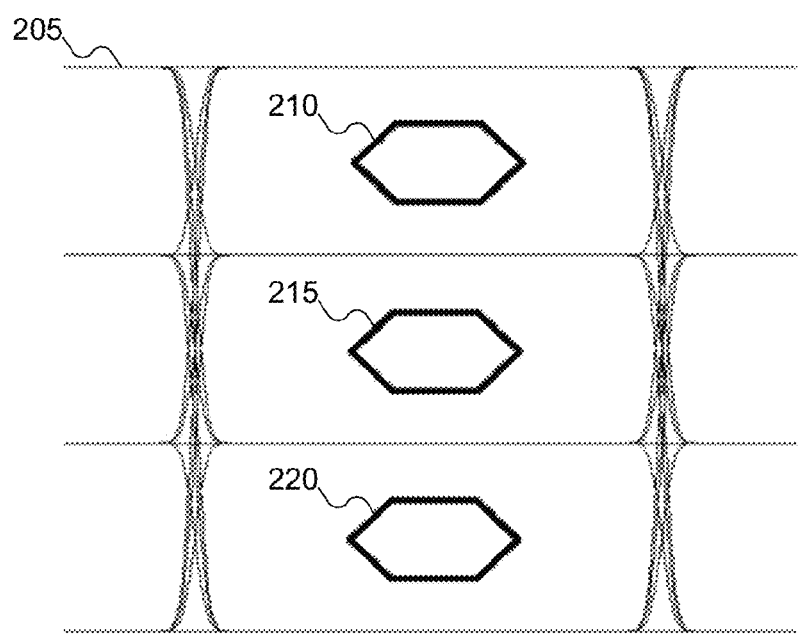
FIG. 2 shows an eye diagram with multiple eyes and a mask with multiple polygons.

There is no reason to limit a signal to only two possible target voltages. For example, a pulse-amplitude modulation (PAM) signal can specify multiple different values, thereby compressing the data carried by the signal. FIG. 2 shows an example of a PAM signal that uses four signal levels, thereby encoding two bits. This signal therefore has three eyes (separating the four target values). As compared with FIG. 1, FIG. 2 shows an idealized version of the signal, rather than a PDF of the signal, which explains why FIG. 1 shows the PDF as spreading out somewhat from the desired signal patterns.

In general, the discussion below focuses on signals with only two target voltages, unless otherwise indicated. But the discussion below can easily be generalized to cover signals with more than two target voltages (and therefore more than one eye in the eye diagram), and embodiments of the invention are intended to cover signals with any number of eyes, regardless of the form taken by the signal. A description of how embodiments of the invention can be generalized to multiple eyes is described below.

In practice, a PDF eye can be computed as a discrete array. Oscilloscopes can accumulate hit counts at all points of their graticule. Both the one-dimensional and two-dimensional PDF eyes can be computed from these counts. The one-dimensional PDF eye can be computed by normalizing each vertical line so that the values in each line sum to 1. The two-dimensional PDF eye can be computed by normalizing the entire two-dimensional array so that all values in the array sum to 1. With large statistics (meaning large enough that the number of hits is about the same for all vertical lines), the values in the two eyes will be proportional. Differences will typically only occur due to the different normalizations.

Modeled noise and jitter can also be added to a PDF eye by convolution.

Hit Rate Array

The accumulation of hits in a scope's waveform database yields a hit rate (also known as a hit ratio) at every point. Each hit rate is an estimator of the probability of having a hit at that point, the accuracy of the estimate depending on the number of measurements. A two-dimensional PDF P(t,v) can be computed by suitably normalizing the array of hit ratios. With enough data to provide good statistics, such an eye diagram will also look like FIG. 1 (or a non-idealized version of FIG. 2).

Partial PDF Eye

A one-dimensional partial PDF eye is just a one-dimensional PDF eye for partial information. Consider the set of all possible waveforms for a given channel. Select a particular unit interval and divide the set of waveforms into two subsets. One subset contains all waveforms that represent a 0 bit in the selected unit interval while the other contains all waveforms representing a 1 bit in that unit interval. Each waveform in either subset might be either 0 or 1 in any other unit interval, i.e., there is no restriction save on the selected unit interval.

There are two partial PDF eyes denoted $P_0$ and $P_1$ corresponding to the two waveform subsets, each capturing half the information of the entire set of waveforms. For convenience, assume that $P_0$ and $P_1$ each integrate to 0.5 at each point in time.

$$\int_{-\infty}^{\infty} P_0(t,v) dv = 0.5 \text{ and } \int_{-\infty}^{\infty} P_1(t,v) dv = 0.5$$

The full PDF eye is then the sum of the two partial eyes.

$$P(t,v) = P_0(t,v) + (t,v)$$

Figure 3A:
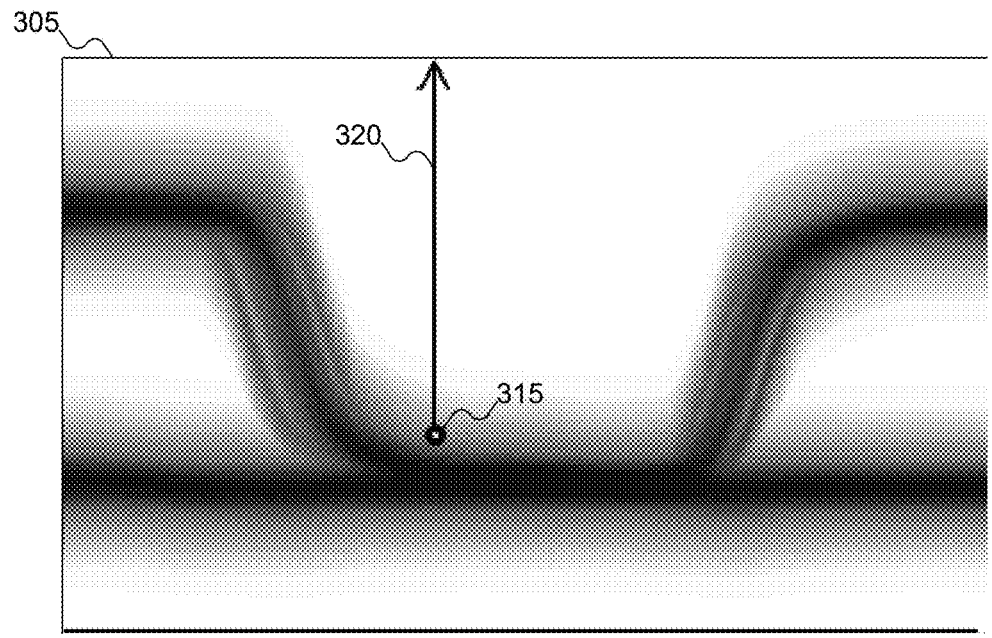
FIGS. 3A-3B show partial eye information for the eye diagram of FIG. 1.
Figure 3B:
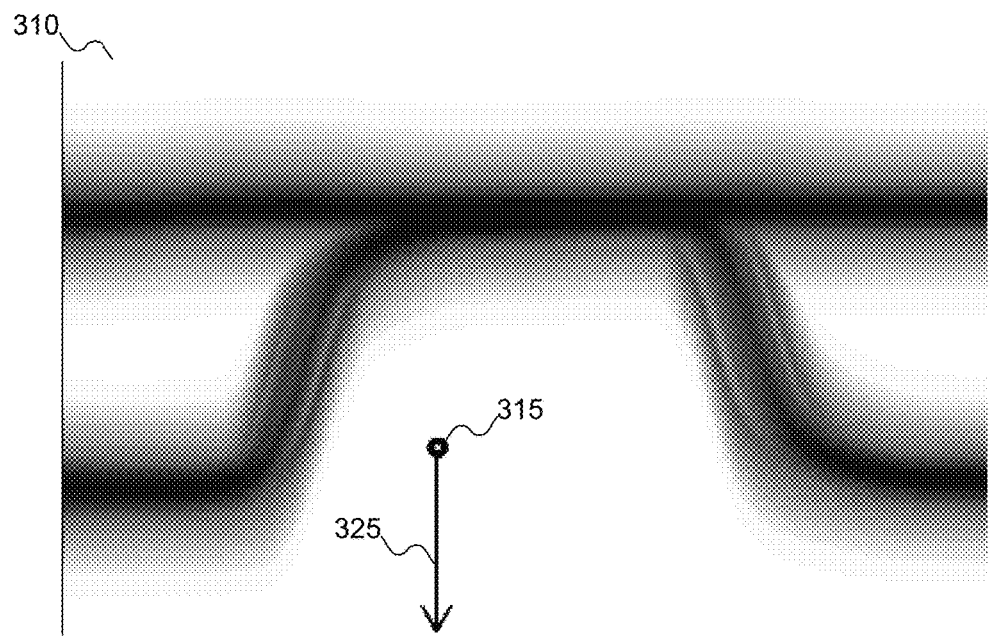

FIGS. 3A-3B show examples of partial eyes that sum to produce the eye diagram shown in FIG. 1. In FIG. 3A, graph 305 shows the partial eye including all waveforms that represent a 0 bit in the unit interval, while in FIG. 3B, graph 310 shows the partial eye including all waveforms that represent a 1 bit in the unit interval.

CDF—Cumulative Distribution Function

The cumulative distribution function gives the probability that a random variable will have a value less than or equal to a given value. The CDF can be obtained by integrating the PDF over an appropriate range. For example, in FIGS. 3A-3B, point 315 is shown, and is intended to represent the same time/voltage pair in graphs 305 and 310. The probability that the voltage of a waveform representing a 0 bit, at the time, will be greater than the voltage represented by point 315 can be computed by integrating the graph shown in FIG. 3A from point 315 to the top (as shown by arrow 320). The probability that the voltage of a waveform representing a 1 bit, at the time, will be less than the voltage represented by point 315 can be computed by integrating the graph shown in FIG. 3B up from the bottom to point 315 (as shown by arrow 325). This pair of CDFs can be used in the computation of the bit error rate (combining arrow 325 with arrow 320).

BER—Bit Error Rate

A BER has two equivalent interpretations. The BER is both the rate at which bits are misidentified and the probability of any one bit being misidentified. For example, a BER expressed as the rate of 3 errors per $10^{12}$ bits can also be expressed as the probability $3 \times 10^{-12}$ that any given bit is in error. A BER value can be computed from the partial PDFs by a pair of integrations: that is, using the two CDFs discussed above, or alternatively as described below.

BER Eye

A BER eye is a function B(t,v) of two variables, time and voltage, whose value is the probability (not a probability density) of a bit error given that the receiver's decision point is (t,v). In other words, the value B(t,v) is the BER for the point represented by (t,v).

BER Limit

For a given BER eye and a given mask, the BER limit is the smallest BER value such that the BER eye passes the mask test.

Given these definitions, it is possible to explain how to compute a BER eye using the one-dimensional partial PDF eyes $P_0$ and $P_1$. Start with $P_0$ and select an arbitrary point in that eye (such as point 315 in FIGS. 3A-3B). Integrating $P_0$ in FIG. 3A from point 315 upwards yields the probability that a waveform representing a 0 is above that point, i.e., the probability of misidentifying a 0 as a 1 if that point were the decision point. Similarly, integrating $P_1$ from point 315 downwards yields the probability of misidentifying a 1 as a 0. The sum of these two probabilities is the BER for that point. Repeating this computation over all points can yield the BER eye.

$$B(t,V) = \int_{V}^{\infty} P_0(t,v) dv + \int_{-\infty}^{V} P_1(t,v) dv$$

where V is the voltage of a selected point (recall that t is treated as fixed in this equation).

As discussed above, the calculation of the BER eye can be generalized from a single eye to multiple eyes. In that case, there are multiple partial eye diagrams, with each partial eye diagram integrating to the reciprocal of the number of number of target voltages. For example, if the signal can take 4 possible target voltages, then each target voltage has a probability of ¼=0.25, and $$\int_{-\infty}^{\infty} P_k(t,v) dv = 0.25$$

The full PDF eye is then the sum of all partial eyes.

$$P(t,v) = \sum_k P_k(t,v)$$

Care must be taken in defining the BER. The objective in calculating the BER is not determining the probability of having some error in a unit interval, but rather in the expected number of errors in a unit interval. This will take into account that the actual number of bit errors in a unit interval may be 0, 1, 2, or more.

Returning to FIG. 1, FIG. 1 shows a BER eye 105, and an overlaid mask 110. If this mask is associated with a specific BER=b, the channel that generated this eye passes the mask test if $$B(t,v) \leq b \text{ for all } (t,v) \text{ in the mask.}$$

An equivalent formulation is $$\max_{t,v} B(t,v) \le b$$

where t and v range over all points of the mask. These same equations apply equally well in the more general case where the eye diagram includes multiple eyes. Thus, for example, FIG. 2 shows graph 205 that includes three eyes, over which three masks 210, 215, and 220 are laid. Given an appropriate definition for B(t,v), the eye passes the mask test if $$B(t,v) \le b \text{ for all } (t,v) \text{ in the mask,}$$

or equivalently, if $$\max_{t,v} B(t,v) \le b$$

So the result of a mask test on a BER eye when a BER is a binary decision PASS/FAIL, where PASS means that any point in the mask may be used as the decision point.

The result of a mask test on a BER eye when no BER is specified is either or both of the following.
 the mask margin at the given BER
 the BER limit such that the mask just barely passes, i.e., the expression from the second inequality above:

$$B(\text{mask}) = \max_{t,v} B(t,v)$$

Graphically the mask margin defines how much the mask can be expanded until it first contacts the given BER contour. The BER limit defines how far down the funnel of a three-dimensional BER eye (not shown) the mask can be dropped until it first contacts some BER contour, i.e., until it first contacts the funnel.

FIG. 4 shows mask 110, describing the dimensions of the graph on which mask 110 is shown. The horizontal axis of the graph represents time, and the vertical axis represents voltage. Thus, mask 110 has time duration 405 (spanning the interval of time over which mask 110 is applied), and voltage range 410 (spanning all possible voltages covered by mask 110).

The problem with this method of calculating the BER eye is that, in practice, $P_0$ and $P_1$ can be precisely obtained only if it is known for each bit whether it was transmitted as 0 or 1. This requires the equipment calculating the BER to control both the sender and the recipient of the signal. While $P_0$ and $P_1$ can be determined in some situations, they cannot be determined in all situations (for example, when the tester is located with the recipient remotely from the sender). Thus, calculating the BER based on $P_0$ and $P_1$ does not provide a means for calculating the BER in all situations.

Embodiments of the invention provide a mechanism for calculating the BER for a mask without using the partial eye PDFs $P_0$ and $P_1$. Two assumptions are used to show how to calculate the BER without using $P_0$ and $P_1$:
 1. There is no appreciable probability of a 0 bit rising above the top of the mask or a 1 bit falling below the bottom of the mask.
 2. At each time t, the maximum BER over the vertical span of the mask is at either the top or the bottom of the mask.

While these assumptions can theoretically limit the applicability of embodiments of the invention, from a practical point of view the excluded cases are ones in which the mask would fail the test anyway. The reasons for these assumptions, and why they do not impose realistic limits on the use of embodiments of the invention, are discussed below.

Recall that the equation for calculating the BER at a time t is expressed as $$B(t,V) = \int_V^\infty P_0(t,v)dv + \int_{-\infty}^V P_1(t,v)dv$$

Using the first assumption, the limits of the integration can be altered, changing the equation to $$B(t,V) = \int_V^{V_T} P_0(t,v)dv + \int_{V_B}^V P_1(t,v)dv$$

where $V_B$ and $V_T$ are the voltages of the bottom and top of the mask, respectively, for time t. $V_B$ and $V_T$ can also be called the minimum voltage and the maximum voltage, respectively.

FIG. 5 shows some examples of the minimum and maximum voltages for mask 110. At time 505, the minimum voltage is shown as voltage 510, while the maximum voltage is shown as voltage 515. In comparison, at time 520, the minimum voltage is voltage 525, while the maximum voltage is voltage 530. Note that minimum voltage 510 at time 505 is greater than minimum voltage 525 at time 520, while maximum voltage 515 at time 505 is less than maximum voltage 530 at time 520. This shows that the span of the voltage for a given time might be less than the full voltage range of the mask.

FIG. 5 suggests that times 505 and 520 are "infinitely thin" time slices. While such an interpretation is theoretically usable, it is not practical to calculate maximum bit error rates for an infinite number of times during the time duration of the mask. Thus, times 505 and 520 typically represent "slices" of time with some width, and there are a finite number of such "slices" in the time duration of the mask.

For the minimum voltage $V_B$, the BER can be calculated as $$B(t,V_B) = \int_{V_B}^{V_T} P_0(t,v)dv + \int_{V_B}^{V_B} P_1(t,v)dv = \int_{V_B}^{V_T} P_0(t,v)dv$$

The second term in the sum is zero, because the limits of the integration are the same. Similarly, the BER for the maximum voltage $V_T$ can be calculated as $$B(t,V_T) = \int_{V_T}^{V_T} P_0(t,v)dv + \int_{V_B}^{V_T} P_1(t,v)dv = \int_{V_B}^{V_T} P_1(t,v)dv$$

In this equation, the first term in the sum is zero, because the limits of the integration are the same. Adding these two equations and using the equation $P = P_0 + P_1$ yields the following $$B(t,V_B) + B(t,V_T) = \int_{V_B}^{V_T} P_0(t,v)dv + \int_{V_B}^{V_T} P_1(t,v)dv = \int_{V_B}^{V_T} P(t,v)dv$$

Using the second assumption, either $B(t,V_B)$ or $B(t,V_T)$ is the maximum BER B(t) for the mask at time t. Therefore, B(t) can be calculated as $$B(t) = \alpha_t \int_{V_B}^{V_T} P(t,v)dv$$

What is the significance of $\alpha_t$? $\alpha_t$ is a scaling factor. If it were to turn out that $B(t,V_B) = B(t,V_T)$, then the integration above would produce a result exactly twice the largest BER at time t, in which case the integration could be multiplied by 0.5 to produce the BER. On the other hand, if one of $B(t,V_B)$ and $B(t,V_T)$ were zero (recall that using the second assumption, one of these two must be the largest BER for the mask at time t), then the integration would produce exactly the maximum BER at time t, in which case the integration could be multiplied by 1. (Obviously, a bit error rate cannot be negative, so the smallest possible value for both B(t,VB) and B(t,$V_T$) would be zero.) Thus, $\alpha_t$ is in the range (0.5,1).

Even taking the conservative approach and using $\alpha_t$=1, the BER would be off by no more than a factor of 2, which is irrelevant on the logarithmic scale usually used with BER measurements. And if the eye diagram is vertically symmetric so that B(t,$V_B$) and B(t,$V_T$) are equal, $\alpha_t$=0.5 can be used.

These two results with $\alpha_t$=0.5 and $\alpha_t$=1 are called the symmetric BER and the asymmetric BER, respectively. An algorithm computing these results should be able to choose one of these bounding values or an estimated intermediate value based on the symmetry of the eye diagram.

The BER limit for the entire mask is given by $$B = \max_t B(t)$$

where t spans the entire time duration of the mask.

Where the signal can encode more than two possible values, the assumptions extend naturally. If a waveform takes a voltage value at a particular level, the waveform is assumed not to extend higher than the top of the polygon above the level, or below the bottom of the polygon below the level. So, for example, in the waveform shown in FIG. 2, the maximum possible value for a waveform taking the lowest voltage value is assumed to be the top of polygon 220. For a waveform taking the second lowest voltage value, the voltage can be no lower than the bottom of polygon 220, and no higher than the top of polygon 215. For a waveform taking the second highest voltage value, the voltage can be no lower than the bottom of polygon 215, and no higher than the top of polygon 210. And for a waveform taking the highest voltage value, the voltage can be no lower than the bottom of polygon 210. A person of ordinary skill in the art will understand how this can extend to waveforms carrying even more than four possible values.

The second assumption generalizes to the worst point in any polygon (at a given time t) being at the top or bottom of the polygon. This leads to the equation $$B(t, V_{a,T}, V_{b,T}, V_{c,T}) = B(t, V_{a,B}, V_{b,B}, V_{c,B}) = \int_{V_{a,B}}^{V_{a,T}} Pdv + \int_{V_{b,B}}^{V_{b,T}} Pdv + \int_{V_{c,B}}^{V_{c,T}} Pdv$$

(Some scaling factors can be introduced or omitted, depending on how pairs of bits are coded as voltages.) Thus, for an eye diagram that includes multiple eyes, the equation for the BER for the mask can be computed as $$B(t) = \alpha_t \int_{\substack{all \\ polygons}} P(t, v) dv$$

where $\alpha_t$ takes a value in some range. $\alpha_t$ might be larger than 1 or less than 0.5, depending on circumstances, but the range can be defined in advance given the specifics of the coding and the number of eyes in the eye diagram.

It is now worthwhile to consider the assumptions of this model. Recall that the first assumption is that there is no appreciable probability of a 0 bit rising above the top of the mask or a 1 bit falling below the bottom of the mask. Were either of these situations to occur, the calculated BER would be too low. But if either of these situations were to occur, the waveform would be suffering from severe jitter, noise, or crosstalk. In that case, the BER is of little significance: these effects are far too excessive for the waveform to be usable.

Recall that the second assumption is that the maximum BER occurs at either the minimum or maximum voltage of the mask. The validity of this assumption can be seen in FIGS. 6A-6C. FIGS. 6A-6C show the partial eye information, measuring voltage (on the vertical axis) against probability (on the horizontal axis), for a fixed time T. Recall that the BER at a given time T for a given voltage V can be expressed as $$B(T,V) = \int_V^\infty P_0(T,v) dv + \int_{-\infty}^V P_1(T,v) dv$$

Areas 605, 610, and 615 show the area representing this BER, calculated for different voltages V. As can be seen from a visual inspection of the graphs, the minimum area occur where the curves $P_0$ and $P_1$ cross, whereas the maximum areas occur where $P_0$ and $P_1$ reach their extremes. Thus, the extreme voltages of the mask represent the voltages at which the BER would be maximized.

The curves for $P_0$ and $P_1$ shown in FIGS. 6A-6C take normal forms. If the curves were atypical, then $P_0$ and $P_1$ might have more than one crossing. In that case, the maximum BER might not be at the extreme voltages of the mask. For example, consider the possibility that $P_0$ and $P_1$ cross three ties. The middle crossing of $P_0$ and $P_1$ is an inverted crossing: i.e., with increasing voltage, $P_0$ moves from being smaller than $P_1$ to being larger than $P_1$. This inverted crossing is a local maximum of the BER. But as this situation represents a relatively unlikely event, this situation is not a significant concern, and the assumption is sufficient. In fact, the assumption could be weakened to just requiring that there be no global BER maximum inside the mask.

While the above analysis focuses only on a mask with a single polygon, the analysis easily extends to eye diagrams that have more than one eye.

Some communication standards allow the mask to be shifted in the eye diagram in order to find a position that passes the mask test for a given BER. Shifting may be horizontal only, vertical only, or conceivably both horizontal and vertical. When only horizontal shifting is allowed it is computationally feasible to find an optimal position by brute force, i.e., by computing B(mask) for all mask positions and taking the position with the smallest BER.

Brute force may be less feasible if vertical shifting is allowed, especially if there is crosstalk that makes the BER contours have concavities. Brute force may also be infeasible when computing the BER limit. In such cases a feasible approach is via computational geometry.

Figure 7:
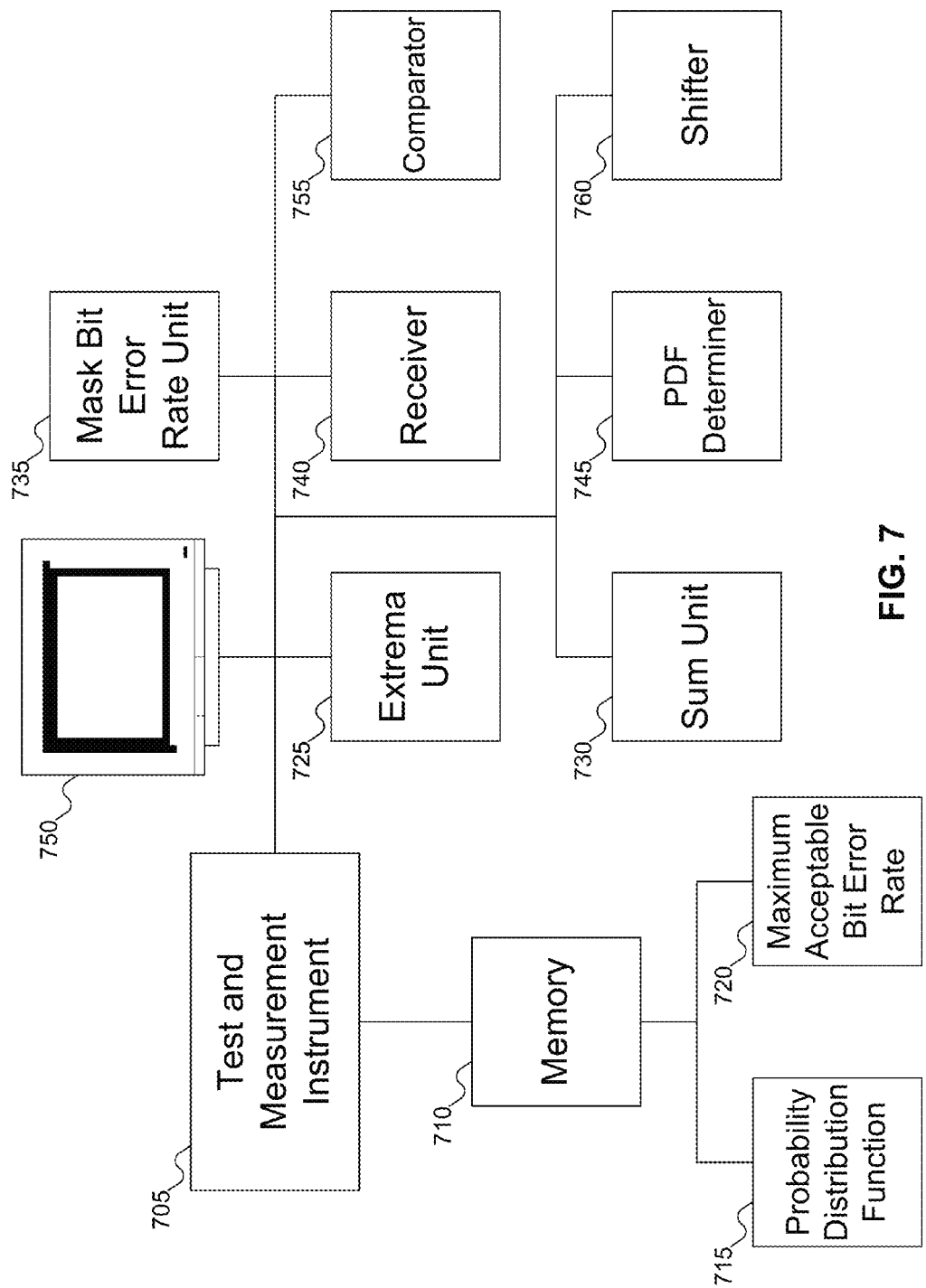
FIG. 7 shows a test and measurement instrument that can determine a bit error rate for a mask in an eye diagram, according to an embodiment of the invention.

Given this explanation about how the bit error rate (BER) can be computed without reference to the partial eye information, a description of the apparatus and the method can now be provided. FIG. 7 shows a test and measurement instrument that can determine a bit error rate for a mask in an eye diagram, according to an embodiment of the invention. In FIG. 7, test and measurement instrument 705 is shown. Test and measurement instrument 705 can be any desired machine, such as an oscilloscope or a dedicated apparatus for determining the bit error rate. In addition, test and measurement instrument 705 can conceivably be any machine capable of computing a bit error rate given the appropriate information. For example, test and measurement instrument 705 could be a general purpose computer that receives signal and other data from another source and computes the bit error rate given that information. Not shown in FIG. 7 are most of the internal components of test and measurement instrument 705 (whatever its form): a person of ordinary skill in the art will recognize what internal components are needed to support a particular structure for test and measurement instrument 705.

Test and measurement can include memory 710. Memory 710 can store information, such as probability distribution function 715 for a signal, as described above, or maximum acceptable bit error rate 720, to use in determining if a mask test is satisfied. Memory 710 can also store additional data as needed by test and measurement instrument 705. Memory 710 can also store software that lists instructions to be executed by a processor of test and measurement instrument 705, to compute the bit error rate for a waveform, for example.

Test and measurement instrument 705 can also include various units. These units can be software units that include instructions to perform various functions, or they can be hardware units designed specifically to provide certain capabilities. These units include extrema unit 725, sum unit 730, and mask bit error rate unit 735. Extrema unit 725 can determine the extrema (that is, the minimum and maximum) voltages for a given time within a mask. Sum unit 730 can compute the sum of the probability distribution function between the minimum and maximum voltages for a given time within a mask. If the eye diagram includes multiple eyes, sum unit 730 can compute the sum of the probability distribution function between the minimum and maximum voltages over all polygons in the mask for a given time within a mask. And mask bit error rate unit 735 can calculate the maximum bit error rate for the mask as a whole.

Test and measurement instrument 705 can also include other elements. Receiver 740 can be used to receive data, regardless of form. For example, receiver 740 can receive a waveform from appropriate sensors, so that the probability distribution function data can be determined (by probability distribution function determiner 745). Or, receiver 740 can receive the probability distribution function data, as computed by another machine.

Test and measurement instrument 705 can also include display 750. Display 750 can be used to present information visually to a user. Examples of information that can be presented to the user include a graphical display of the waveform and its eyes in an eye diagram, the mask (perhaps overlaid on the eye diagram), and whether the mask test is satisfied or not.

Test and measurement instrument 705 can also include comparator 755 and shifter 760. Comparator 755 can be used to compare the bit error rate for the mask as a whole with the maximum acceptable bit error rate for the mask, as defined for the mask test. If bit error rate for the mask as a whole is no greater than the maximum acceptable bit error rate, then the mask test is satisfied. Otherwise, the mask test is not satisfied.

If the mask test is not satisfied, shifter 760 can be used to shift the mask, either horizontally, vertically, or both. As described above, mask shifting can be performed using a brute force approach or using a more algorithmic approach, to determine if there is a mask position that satisfies the mask test. In addition, it is possible that the user can manually position the mask (using display 750) to various positions to test. The user can "grab" the mask with a pointing device and "drag" the mask to a new position, which can then be tested.

Figure 8A:
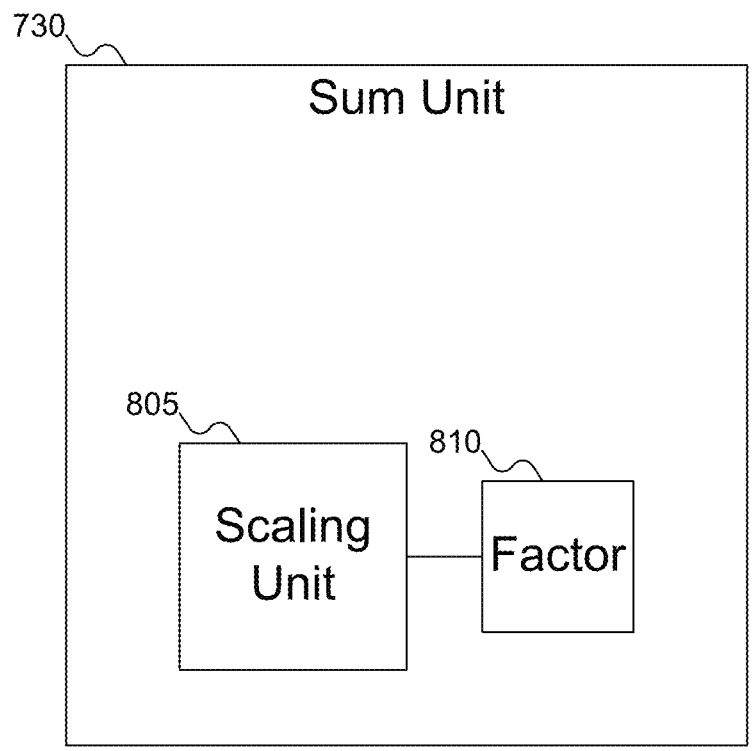
FIGS. 8A-8B show alternative embodiments for the maxima unit of FIG. 7.
Figure 8B:
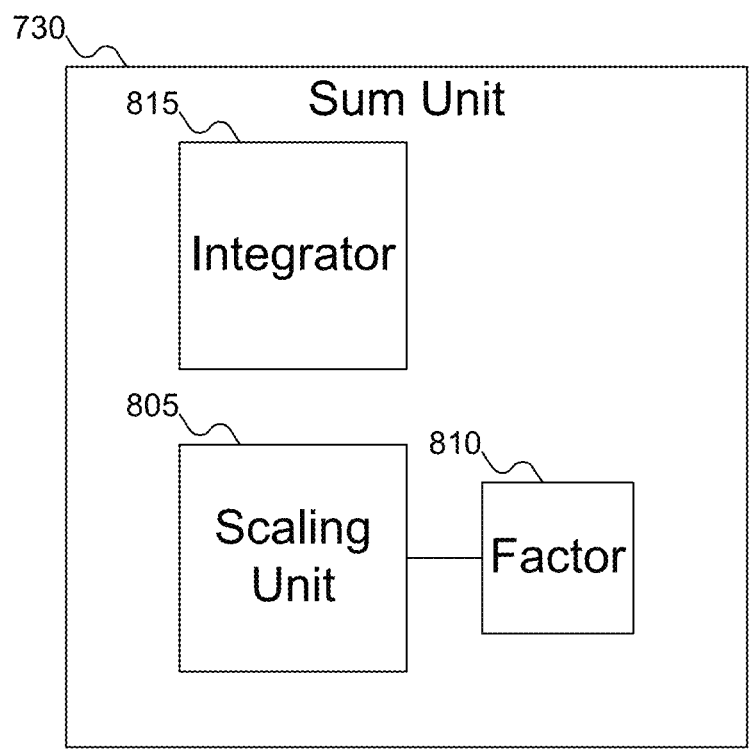

FIGS. 8A-8B show alternative embodiments for the sum unit of FIG. 7. As described above, sum unit 730 can calculate the sum of the probability distribution function between the minimum and maximum voltages for a given time within a mask. This calculation can include scaling the result. In FIG. 8A, sum unit 730 can include scaling unit 805 and can scale the resulting sum by factor 810.

As is understood from calculus, integration is a generalization of summing area under a curve. Since the bit error rate is calculated as an area under a curve, integration can therefore be considered a generalization of summation. Therefore, sum unit 730 can include integrator 815 to perform the summation, as shown in FIG. 8B.

Figure 9A:
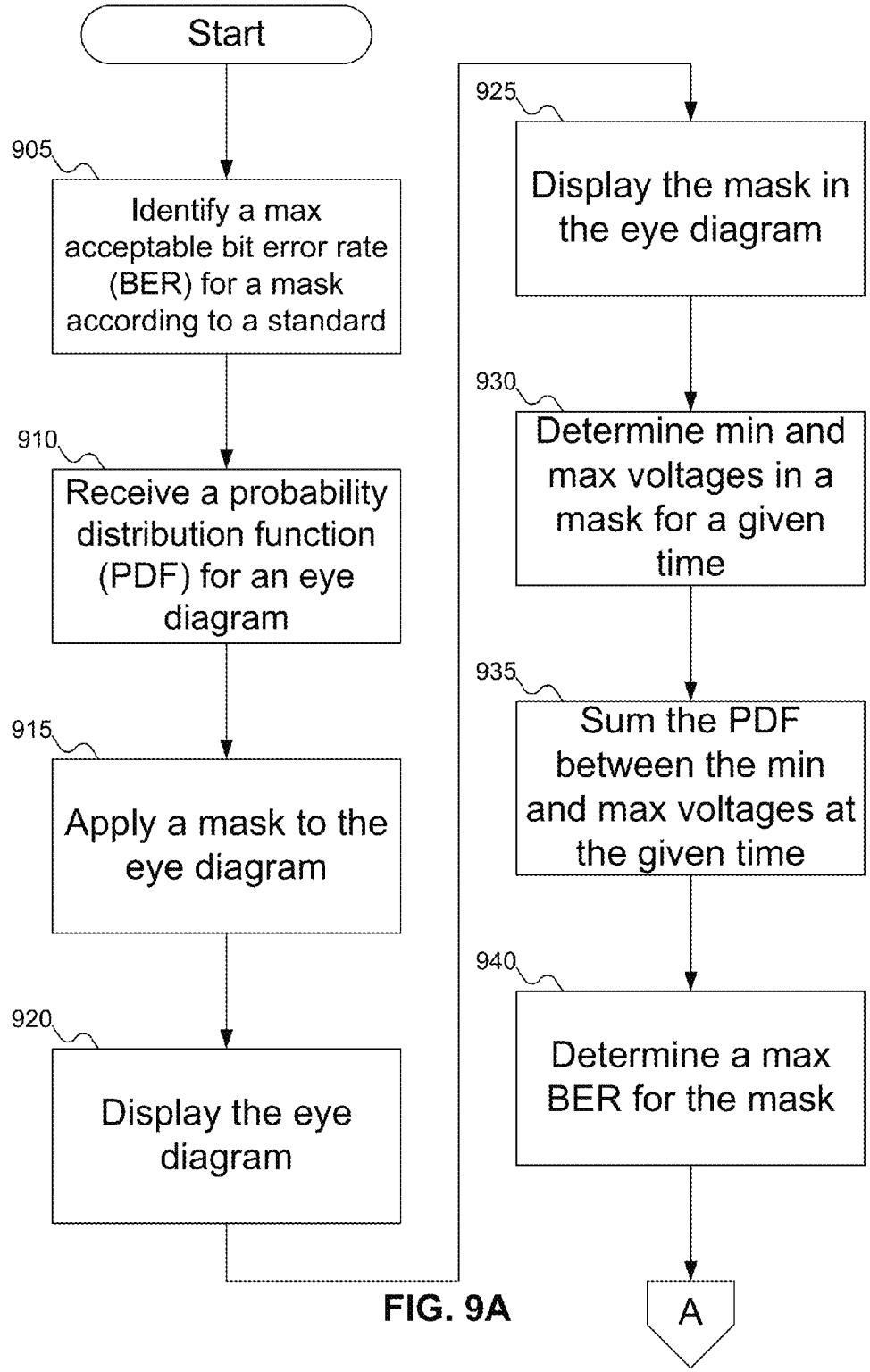
FIGS. 9A-9B show a flowchart of a procedure for determining a bit error rate for a mask using the test and measurement instrument of FIG. 7, according to an embodiment of the invention.
Figure 9B:
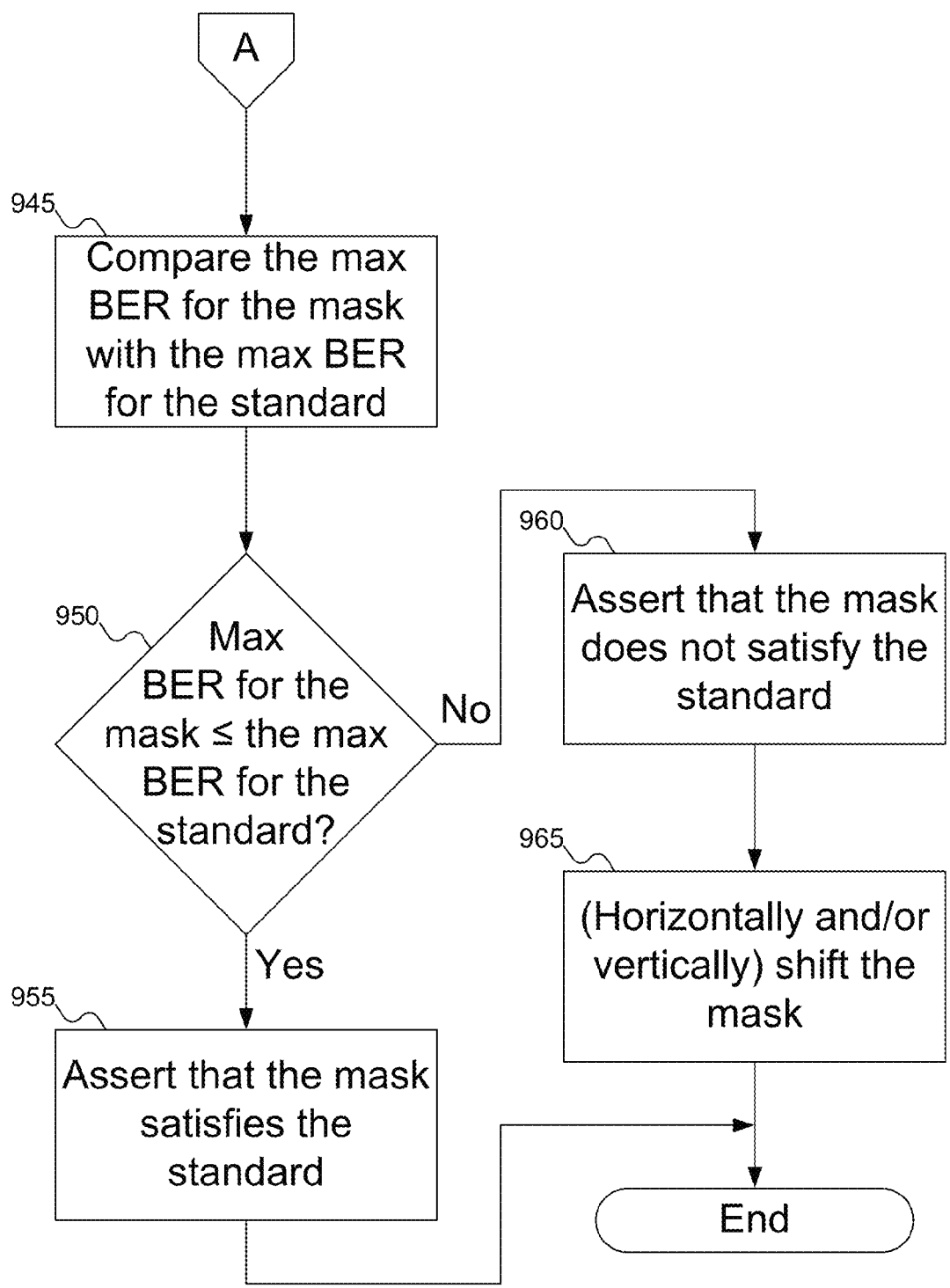

FIGS. 9A-9B show a flowchart of a procedure for determining a bit error rate for a mask using the test and measurement instrument of FIG. 7, according to an embodiment of the invention. In FIG. 9A, at block 905, a maximum acceptable bit error rate for the standard is identified. At block 910, a probability distribution function for an eye diagram is received. At block 915, a mask is applied to the eye diagram. At block 920, the eye diagram is displayed. At block 925, the mask is displayed in the eye diagram. At block 930, for a given time, the minimum and maximum voltages are determined. At block 935, the probability distribution function sum between the minimum and maximum voltages at the given time is determined. At block 940, a maximum bit error rate is determined for the mask, using the maximum bit error rates for each time during the time duration.

Before the maximum bit error rate for the mask can be determined, the maximum bit error rates for each given time during the time duration of the mask must be calculated. While not explicitly shown in FIGS. 9A-9B, a person of ordinary skill in the art would understand that this operation involves repeating blocks 930 and 935 for each given time during the time duration of the mask.

At block 945 (FIG. 9B), the maximum bit error rate for the mask is compared with the maximum acceptable bit error rate for the standard. At block 950, the system determines if the maximum bit error rate for the mask was no greater than the maximum acceptable bit error rate for the standard. If so, then at block 955 the system can assert that the mask test is satisfied: the mask satisfies the standard. If not, then at block 960, the system can assert that the mask test is failed: the mask does not satisfy the standard. In that case, at block 965 the mask can be shifted (either horizontally, vertically, or both) in an attempt to find a position for the mask that satisfies the standard.

Figure 10A:
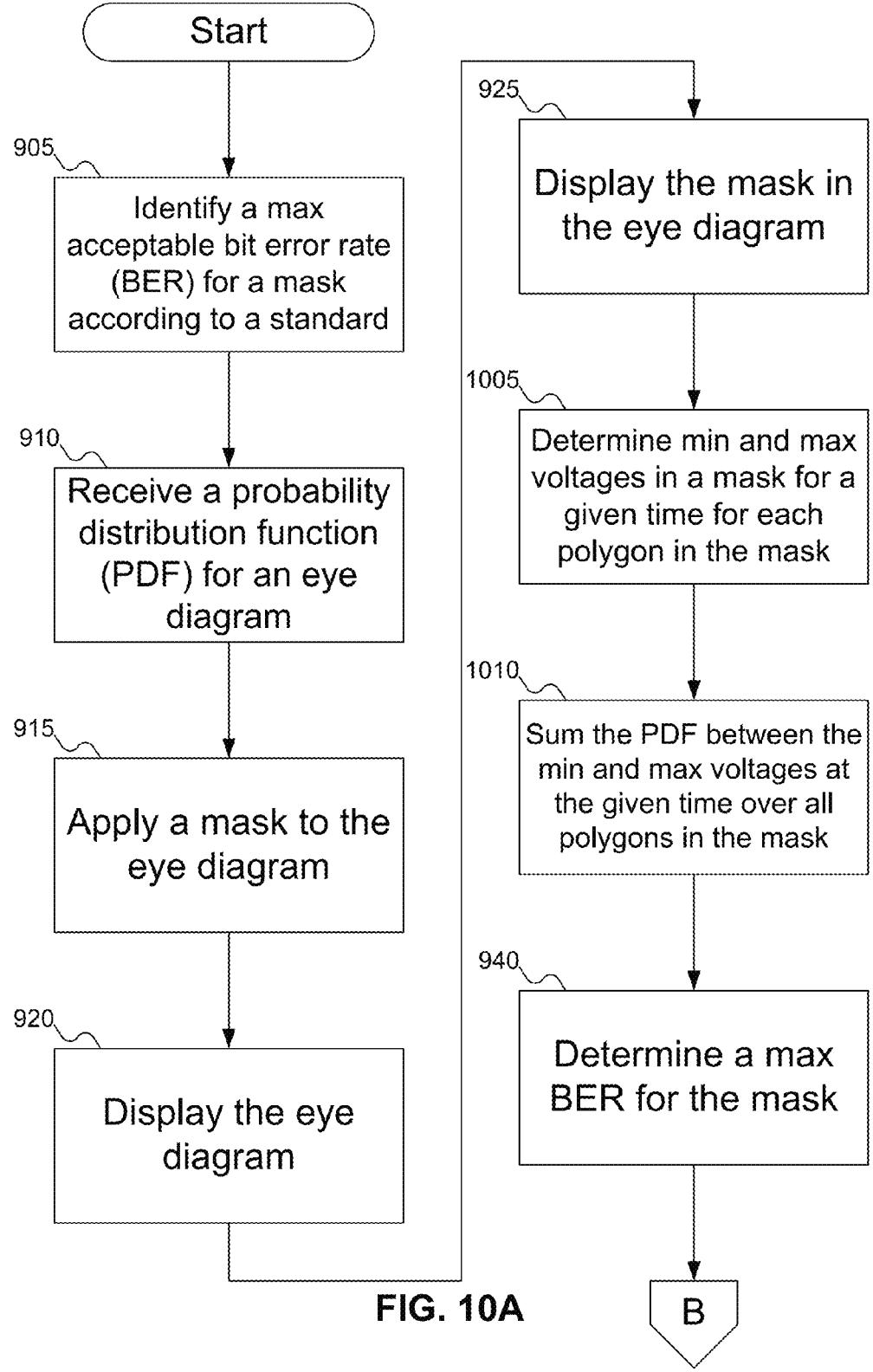
FIGS. 10A-10B show a flowchart of a procedure for determining a bit error rate for a mask including multiple polygons using the test and measurement instrument of FIG. 7, according to an embodiment of invention.
Figure 10B:
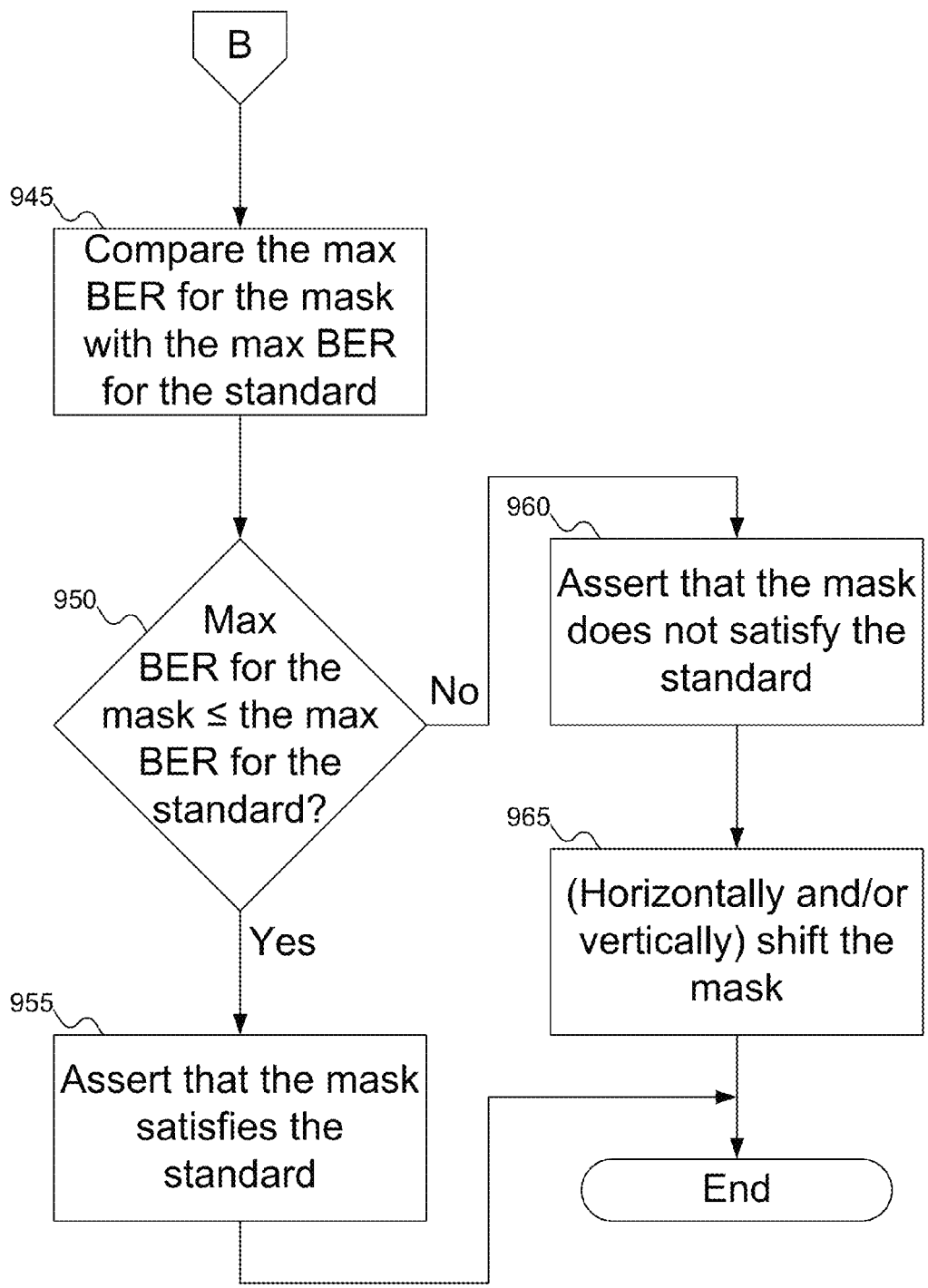

FIGS. 10A-10B show a flowchart of a procedure for determining a bit error rate for a mask including multiple polygons using the test and measurement instrument of FIG. 7, according to an embodiment of invention. As can be seen by a quick comparison of FIGS. 9A-9B and 10A-10B, many blocks are unchanged by using an eye diagram with multiple eyes. In FIG. 10A, at block 905, a maximum acceptable bit error rate for the standard is identified. At block 910, a probability distribution function for an eye diagram is received. At block 915, a mask is applied to the eye diagram. At block 920, the eye diagram is displayed. At block 925, the mask is displayed in the eye diagram. At block 1005, for a given time, the minimum and maximum voltages are determined for each polygon in the mask. At block 1010, the probability distribution function for a given time is summed over all polygons in the mask. At block 940, a maximum bit error rate is determined for the mask, using the maximum bit error rates for each time during the time duration in the mask.

As with FIGS. 9A-9B, before the maximum bit error rate for the mask can be determined, the maximum bit error rates for each given time in the mask during the time duration of the mask must be calculated. While not explicitly shown in FIGS. 10A-10B, a person of ordinary skill in the art would understand that this operation involves repeating blocks 1005 and 1010 for each given time during the time duration of the mask.

At block 945 (FIG. 10B), the maximum bit error rate for the mask is compared with the maximum acceptable bit error rate for the standard. At block 950, the system determines if the maximum bit error rate for the mask was no greater than the maximum acceptable bit error rate for the standard. If so, then at block 955 the system can assert that the mask test is satisfied: the mask satisfies the standard. If not, then at block 960, the system can assert that the mask test is failed: the mask does not satisfy the standard. In that case, at block 965 the mask can be shifted (either horizontally, vertically, or both) in an attempt to find a mask that satisfies the standard.

Figure 11:
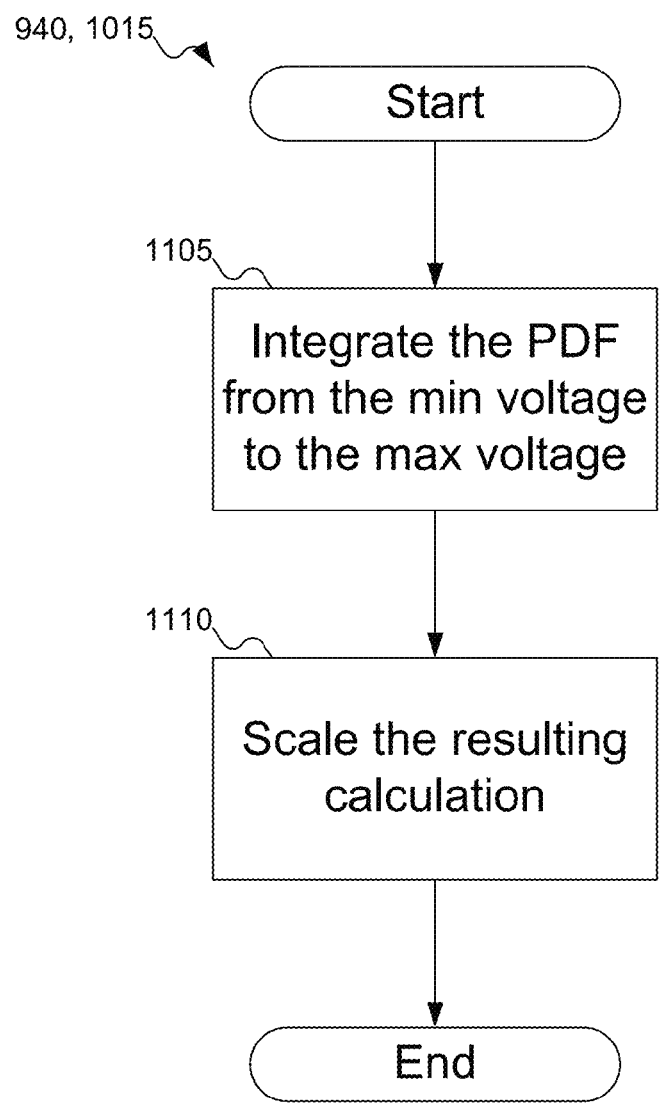
FIG. 11 shows a flowchart of a procedure for calculating the maximum bit error rate at a particular time during the time duration of the mask of FIGS. 1-5 and 2.

FIG. 11 shows a flowchart of a procedure for calculating the maximum bit error rate at a particular time during the time duration of the mask of FIGS. 1-2 and 4-5. At block 1105, the system can integrate the probability distribution function to calculate the bit error rate. At block 1110 the system can scale the resulting calculation to reflect a more accurate calculation of the bit error rate.

Figure 12:
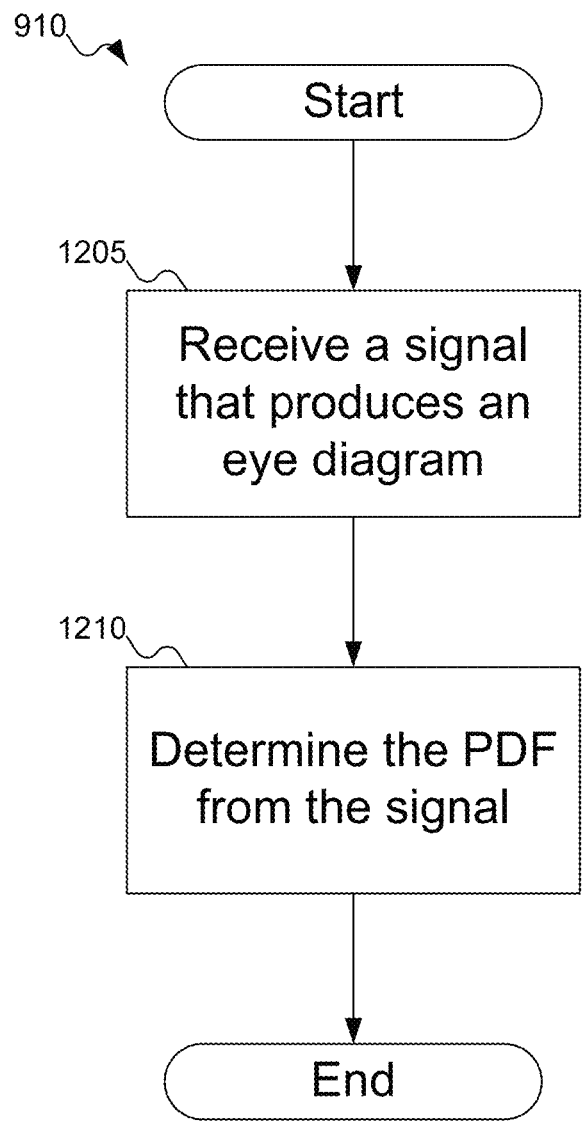
FIG. 12 shows a flowchart of a procedure for calculating the probability distribution function for an eye diagram using the test and measurement instrument of FIG. 1.

FIG. 12 shows a flowchart of a procedure for calculating the probability distribution function for an eye diagram using the test and measurement instrument of FIG. 1. At block 1205, the system receives the signal that produces the eye diagram. At block 1210, the system determines the probability distribution function from the signal.

The above flowcharts show some possible embodiments of the invention. But other embodiments of the invention can organize the blocks in different arrangements, and can include or omit different blocks as desired, or repeat a block (or multiple blocks) as needed. Embodiments of the invention are intended to include all such variations on the flowcharts.

The following discussion is intended to provide a brief, general description of a suitable machine in which certain aspects of the invention may be implemented. Typically, the machine includes a system bus to which is attached processors, memory, e.g., random access memory (RAM), read-only memory (ROM), or other state preserving medium, storage devices, a video interface, and input/output interface ports. The machine may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, or a system of communicatively coupled machines or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine may include embedded controllers, such as programmable or non-programmable logic devices or arrays, Application Specific Integrated Circuits, embedded computers, smart cards, and the like. The machine may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciated that network communication may utilize various wired and/or wireless short range or long range carriers and protocols, including radio frequency (RF), satellite, microwave, Institute of Electrical and Electronics Engineers (IEEE) 810.11, Bluetooth, optical, infrared, cable, laser, etc.

The invention may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Having described and illustrated the principles of the invention with reference to illustrated embodiments, it will be recognized that the illustrated embodiments may be modified in arrangement and detail without departing from such principles. And, though the foregoing discussion has focused on particular embodiments, other configurations are contemplated. In particular, even though expressions such as "in one embodiment" or the like are used herein, these phrases are meant to generally reference embodiment possibilities, and are not intended to limit the invention to particular embodiment configurations. As used herein, these terms may reference the same or different embodiments that are combinable into other embodiments.

Embodiments of the invention can extend to the following statements, without limitation:

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; and a mask BER unit to determine a BER for the mask in the eye diagram from the BER at each time during the time duration of the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; a receiver to receive a signal that produces the eye diagram; and a PDF determiner to determine the PDF for the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram, the sum unit including a scaling unit to scale the calculated BER by a factor no less than 0.5 and no greater than 1; and a mask BER unit to determine a BER for the mask in the eye diagram from the BER at each time during the time duration of the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram, the sum unit including an integrator to integrate the PDF from the minimum voltage to the maximum voltage at each time; and a mask BER unit to determine a BER for the mask in the eye diagram from the BER at each time during the time duration of the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range, the extrema unit operative to determine a minimum voltage and a maximum voltage for each polygon in the mask in the eye diagram at each time during the time duration of the mask in the eye diagram; a sum unit to calculate a BER at each time from the PDF using the minimum voltage and the maximum voltage at each time during the time duration of the mask in the eye diagram, the sum unit operative to calculate a BER at each time from the PDF using the minimum voltage and the maximum voltage over all polygons at each time during the time duration of the mask in the eye diagram; and a mask BER unit to determine a BER for the mask in the eye diagram from the BER at each time during the time duration of the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range, the extrema unit operative to determine a minimum voltage and a maximum voltage for each polygon in the mask in the eye diagram at each time during the time duration of the mask in the eye diagram; a sum unit to calculate a BER at each time from the PDF using the minimum voltage and the maximum voltage at each time during the time duration of the mask in the eye diagram, the sum unit operative to calculate a BER at each time from the PDF using the minimum voltage and the maximum voltage over all polygons at each time during the time duration of the mask in the eye diagram, the sum unit including a scaling unit to scale the calculated BER by a factor; and a mask BER unit to determine a BER for the mask in the eye diagram from the BER at each time during the time duration of the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; and a display.

An embodiment of the invention includes a system, comprising: a test and measurement instrument; a memory in the test and measurement instrument capable of storing a probability distribution function for an eye diagram, the memory capable of storing a maximum acceptable BER for the mask in the eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; a comparator to compare the BER for the mask in the eye diagram with the maximum acceptable BER for the mask in the eye diagram; and a display operative to indicate whether the BER for the mask in the eye diagram is no greater than the maximum acceptable BER for the mask in the eye diagram.

An embodiment of the invention includes a system, comprising: a test and measurement instrument; a memory in the test and measurement instrument capable of storing a probability distribution function for an eye diagram, the memory capable of storing a maximum acceptable BER for the mask in the eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; a comparator to compare the BER for the mask in the eye diagram with the maximum acceptable BER for the mask in the eye diagram; a display operative to indicate whether the BER for the mask in the eye diagram is no greater than the maximum acceptable BER for the mask in the eye diagram; and a shifter to shift the mask in the eye diagram if the BER for the mask in the eye diagram is greater than the maximum acceptable BER for the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; and a display operative to present the BER for the mask in the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; and a display operative to present the eye diagram.

An embodiment of the invention includes a system, comprising: a test and measurement instrument; a memory in the test and measurement instrument capable of storing a probability distribution function for an eye diagram; an extrema unit to determine a minimum voltage and a maximum voltage for a mask in the eye diagram at each time during a time duration of the mask in the eye diagram, the mask having the pre-determined time duration and a pre-determined voltage range; a sum unit to calculate a BER at each time from the PDF using the minimum voltage and the maximum voltage at each time during the time duration of the mask in the eye diagram; a mask BER unit to determine a BER for the mask in the eye diagram from the BER at each time during the time duration of the mask in the eye diagram; and a display operative to present the eye diagram and to present the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram, including receiving a signal that produces an eye diagram and determining the PDF from the signal; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; and applying the mask to the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; identifying a maximum acceptable BER for the mask in the eye diagram according to a standard; comparing the BER for the mask in the eye diagram with the maximum acceptable BER for the mask in the eye diagram; and asserting that the mask in the eye diagram satisfies the standard if the BER for the mask in the eye diagram is no greater than the maximum acceptable BER for the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; identifying a maximum acceptable BER for the mask in the eye diagram according to a standard; comparing the BER for the mask in the eye diagram with the maximum acceptable BER for the mask in the eye diagram; asserting that the mask in the eye diagram satisfies the standard if the BER for the mask in the eye diagram is no greater than the maximum acceptable BER for the mask in the eye diagram; and, if the BER for the mask in the eye diagram is greater than the maximum acceptable BER for the mask in the eye diagram, shifting the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; identifying a maximum acceptable BER for the mask in the eye diagram according to a standard; comparing the BER for the mask in the eye diagram with the maximum acceptable BER for the mask in the eye diagram; asserting that the mask in the eye diagram satisfies the standard if the BER for the mask in the eye diagram is no greater than the maximum acceptable BER for the mask in the eye diagram; and, if the BER for the mask in the eye diagram is greater than the maximum acceptable BER for the mask in the eye diagram, horizontally shifting the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; identifying a maximum acceptable BER for the mask in the eye diagram according to a standard; comparing the BER for the mask in the eye diagram with the maximum acceptable BER for the mask in the eye diagram; asserting that the mask in the eye diagram satisfies the standard if the BER for the mask in the eye diagram is no greater than the maximum acceptable BER for the mask in the eye diagram; and, if the BER for the mask in the eye diagram is greater than the maximum acceptable BER for the mask in the eye diagram, vertically shifting the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time, including scaling the calculated BER by a factor no less than 0.5 and no greater than 1; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time including calculating an integral of the PDF from the minimum voltage at that time to the maximum voltage at that time; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time including determining a minimum voltage at that time and a maximum voltage at that time for each polygon in the mask in the eye diagram; at each time during the time duration of the mask in the eye diagram, calculating, using a test and measurement instrument, a BER as a sum of the PDF from the minimum voltage at that time to the maximum voltage at that time including calculating the BER as a sum of the PDF from the minimum voltage at that time to the maximum voltage at that time over all polygons in the mask in the eye diagram; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time including determining a minimum voltage at that time and a maximum voltage at that time for each polygon in the mask in the eye diagram; at each time during the time duration of the mask in the eye diagram, calculating, using a test and measurement instrument, a BER as a sum of the PDF from the minimum voltage at that time to the maximum voltage at that time including calculating the BER as a sum of the PDF from the minimum voltage at that time to the maximum voltage at that time over all polygons in the mask in the eye diagram including scaling the sum of the BER for the minimum voltage at that time and the BER for the maximum voltage at that time for each polygon in the mask in the eye diagram; and determining, using the test and measurement instrument, a BER for the mask in the eye diagram as a maximum of all BERs at each time during the time duration of the mask in the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; and displaying the eye diagram.

An embodiment of the invention includes a method for determining a bit error rate for a mask in an eye diagram, comprising: receiving a probability distribution function for an eye diagram; at each time during a time duration of a mask in the eye diagram, the mask having the pre-determined time duration and a pre-determined voltage range, determining a minimum voltage of the mask in the eye diagram at that time and a maximum voltage of the mask in the eye diagram at that time; at each time during the time duration of the mask in the eye diagram, calculating, using a test and measurement instrument, a BER as a sum of the PDF from the minimum voltage at that time to the maximum voltage at that time; determining, using the test and measurement instrument, a BER for the mask in the eye diagram as a maximum of all BERs at each time during the time duration of the mask in the eye diagram; and displaying the eye diagram and the mask in the eye diagram.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as can come within the scope and spirit of the following claims and equivalents thereto.

What is claimed is:

1. A system, comprising:
   a test and measurement instrument;
   a memory in the test and measurement instrument capable of storing a probability distribution function (PDF) for an eye diagram;
   an extrema unit to determine a minimum voltage and a maximum voltage for a mask in the eye diagram at each time during a time duration of the mask in the eye diagram, the mask having a pre-determined time duration and a pre-determined voltage range;
   a sum unit to calculate a bit error rate (BER) at each time from the PDF using the minimum voltage and the maximum voltage at each time during the time duration of the mask in the eye diagram; and
   a mask BER unit to determine a BER for the mask in the eye diagram from the BER at each time during the time duration of the mask in the eye diagram.

2. The system according to claim 1, further comprising:
   a receiver to receive a signal that produces the eye diagram; and
   a PDF determiner to determine the PDF for the eye diagram.

3. The system according to claim 1, wherein the sum unit includes a scaling unit to scale the calculated BER by a factor no less than 0.5 and no greater than 1.

4. The system according to claim 1, wherein the sum unit includes an integrator to integrate the PDF from the minimum voltage to the maximum voltage at each time.

5. The system according to claim 1, wherein:
   the extrema unit is operative to determine a minimum voltage and a maximum voltage for each polygon in the mask in the eye diagram at each time during the time duration of the mask in the eye diagram; and
   the sum unit is operative to calculate a BER at each time from the PDF using the minimum voltage and the maximum voltage over all polygons at each time during the time duration of the mask in the eye diagram.

6. The system according to claim 5, wherein the sum unit includes a scaling unit to scale the calculated BER by a factor.

7. The system according to claim 1, further comprising a display.

8. The system according to claim 7, wherein:
   the memory is capable of storing a maximum acceptable BER for the mask in the eye diagram;
   the system further comprises a comparator to compare the BER for the mask in the eye diagram with the maximum acceptable BER for the mask in the eye diagram; and
   the display is operative to indicate whether the BER for the mask in the eye diagram is no greater than the maximum acceptable BER for the mask in the eye diagram.

9. The system according to claim 8, further comprising a shifter to shift the mask in the eye diagram if the BER for the mask in the eye diagram is greater than the maximum acceptable BER for the mask in the eye diagram.

10. The system according to claim 7, wherein the display is operative to present the BER for the mask in the eye diagram.

11. The system according to claim 7, wherein the display is operative to present the eye diagram.

12. The system according to claim 11, wherein the display is further operative to present the mask in the eye diagram.

13. A method for determining a bit error rate (BER) for a mask in an eye diagram, comprising:
   receiving a probability distribution function (PDF) for the eye diagram;
   at each time during a time duration of the mask in the eye diagram, the mask having a pre-determined time duration and a pre-determined voltage range, determining a minimum voltage of the mask in the eye diagram at that time and a maximum voltage of the mask in the eye diagram at that time;

at each time during the time duration of the mask in the eye diagram, calculating, using a test and measurement instrument, a BER as a sum of the PDF from the minimum voltage at that time to the maximum voltage at that time; and determining, using the test and measurement instrument, a BER for the mask in the eye diagram as a maximum of all BERs at each time during the time duration of the mask in the eye diagram.

14. The method according to claim 13, wherein receiving the probability distribution function for the eye diagram includes:

receiving a signal that produces an eye diagram; and
determining the PDF from the signal.

15. The method according to claim 13, further comprising applying the mask to the eye diagram.

16. The method according to claim 13, further comprising:

identifying a maximum acceptable BER for the mask in the eye diagram according to a standard;

comparing the BER for the mask in the eye diagram with the maximum acceptable BER for the mask in the eye diagram; and asserting that the mask in the eye diagram satisfies the standard if the BER for the mask in the eye diagram is no greater than the maximum acceptable BER for the mask in the eye diagram.

17. The method according to claim 16, further comprising, if the BER for the mask in the eye diagram is greater than the maximum acceptable BER for the mask in the eye diagram, shifting the mask in the eye diagram.

18. The method according to claim 17, wherein shifting the mask in the eye diagram includes horizontally shifting the mask in the eye diagram.

19. The method according to claim 17, wherein shifting the mask in the eye diagram includes vertically shifting the mask in the eye diagram.

20. The method according to claim 13, wherein calculating a BER as a sum of the PDF from the minimum voltage at that time to the maximum voltage at that time includes scaling the calculated BER by a factor no less than 0.5 and no greater than 1.

21. The method according to claim 13, wherein calculating a BER as a sum of the PDF from the minimum voltage at that time to the maximum voltage at that time includes calculating an integral of the PDF from the minimum voltage at that time to the maximum voltage at that time.

22. The method according to claim 13, wherein:

determining the minimum voltage at that time and the maximum voltage at that time includes determining a minimum voltage at that time and a maximum voltage at that time for each polygon in the mask in the eye diagram; and calculating a BER as a sum of the PDF from the minimum voltage at that time to the maximum voltage at that time includes calculating the BER as a sum of the PDF from the minimum voltage at that time to the maximum voltage at that time over all polygons in the mask in the eye diagram.

23. The method according to claim 22, wherein calculating the BER as a sum of the PDF from the minimum voltage at that time to the maximum voltage at that time over all polygons in the mask in the eye diagram includes scaling the sum of the PDF for the minimum voltage at that time and the PDF for the maximum voltage at that time for each polygon in the mask in the eye diagram.

24. The method according to claim 13, further comprising displaying the eye diagram.

25. The method according to claim 24, wherein displaying the eye diagram includes displaying the mask in the eye diagram.

* * * * *